United States Patent [19]

Sago et al.

[11] Patent Number: 4,941,426
[45] Date of Patent: Jul. 17, 1990

[54] THIN-FILM COATING APPARATUS

[75] Inventors: Hiroyoshi Sago; Hideyuki Mizuki; Katsuhiko Kudo, all of Kanagawa; Muneo Nakayama, Tokyo, all of Japan

[73] Assignee: Tokyo Ohka Kogyo Co., Ltd., Kanagawa, Japan

[21] Appl. No.: 245,464

[22] Filed: Sep. 16, 1988

[30] Foreign Application Priority Data

Sep. 18, 1987 [JP] Japan .................. 62-142731[U]

[51] Int. Cl.$^5$ .............................................. B05C 13/02
[52] U.S. Cl. ........................................ 118/52; 118/50
[58] Field of Search .................................. 118/52, 50

[56] References Cited

U.S. PATENT DOCUMENTS 4,108,109 8/1978 Barger ................... 118/52
4,393,807 7/1983 Fujimura ................ 118/52

FOREIGN PATENT DOCUMENTS 0012670 1/1979 Japan ..................... 118/52
0098574 8/1979 Japan ..................... 118/52

OTHER PUBLICATIONS

IBM Tech. Disclosure Bulletin, vol. 20, No. 11, 3/78, 4082-3.
IBM Tech. Disclosure Bulletin, vol. 16, No. 6, 11/73, 1730.

*Primary Examiner*—Sam Silverberg
*Attorney, Agent, or Firm*—Irving M. Weiner; Joseph P. Carrier; Pamela S. Burt

[57] ABSTRACT

A thin-film coating apparatus rotates a member on which a coating solution is dropped to spread the coating solution over the member. The thin-film coating apparatus comprises a spinner for securely supporting the member, a casing firmly attached to the spinner in surrounding relation to the spinner and the member, and a lid for closing an opening in the casing through which the member can be brought into and out of the casing, thereby defining a closed processing chamber in the casing.

4 Claims, 2 Drawing Sheets

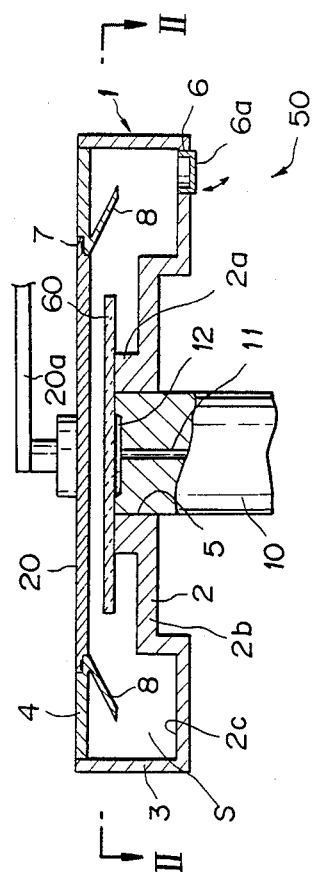
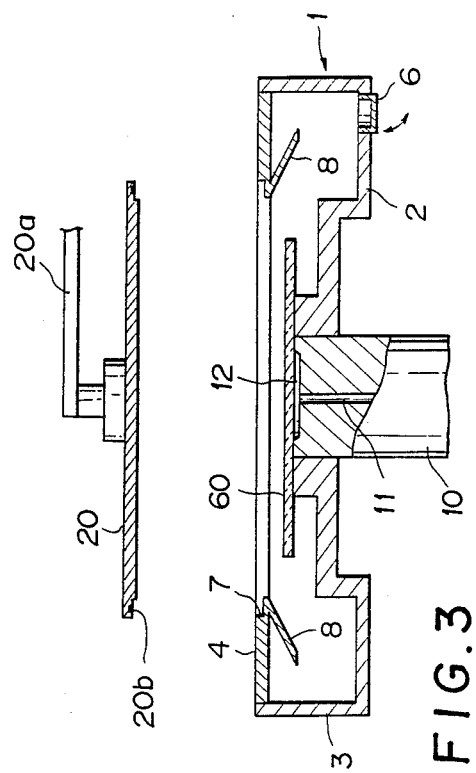
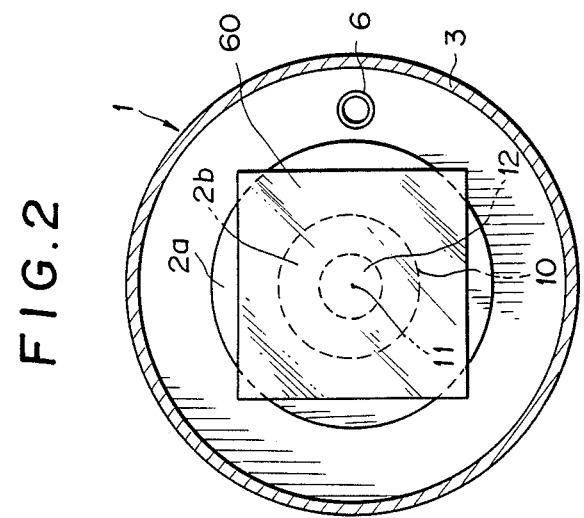

THIN-FILM COATING APPARATUS

BACKGROUND OF THE INVENTION

1. Field of the Invention:

The present invention relates to an apparatus for coating the surface of a semiconductor wafer, a print circuit board, a glass plate, a printing plate, or the like with a photoresist, a diffusing agent, a coating solution for forming a silicon oxide coating, or the like.

2. Description of the Relevant Art:

As disclosed in Japanese Laid-Open Patent Publication No. 58-197732, an apparatus for coating a photoresist or a diffusing agent on a semiconductor wafer has a spinner for placing the semiconductor wafer thereon. The spinner is disposed in a cup surrounding the spinner. The semiconductor wafer placed on the spinner is fixed thereto by vacuum attraction. In operation, the wafer is rotated at a high speed by high-speed rotation of the spinner, and at the same time a photoresist, for example, is dropped onto the center of the upper surface of the wafer. The dropped photoresist is uniformly spread over the surface of the wafer under centrifugal forces produced by the rotation of the spinner. While the spinner is rotating, the cup is also rotated. Therefore, any photoresist scattered off the wafer toward the cup is repelled by the cup substantially in the direction of rotation of the cup. As a result, the scattered droplets of the photoresist from the wafer may be applied again to the wafer.

The cup is open through its upper portion, and the direction of rotation of the cup is irrespective of the direction of rotation of the wafer. Therefore, where a glass plate of square shape is to be coated, the following problems occur: FIG. 4 of the accompanying drawings shows a square glass plate 60 to be coated, and FIG. 5 is a cross-sectional view taken along line V—V of FIG. 4. A coating solution R is applied as droplets to the center O of the glass plate 60 fixed to a spinner (not shown), while at the same time the glass plate 60 is rotated clockwise in the direction of the arrow a in FIG. 4 by the spinner. The dropped solution R is spread radially outwardly as indicated by the arrows b under centrifugal forces toward the peripheral edge of the glass plate 60. Some of the coating solution R which has reached the peripheral edge of the glass plate 60 is not scattered off the edge, but moves in the direction of the arrows c due to inertia until finally it gathers on the corners of the glass plate 60. Therefore, the layer of the coating solution R on the glass plate 60 is progressively thicker toward each of the corners of the glass plate 60. Since the cup is open through its upper portion, the thicker layer portions of the coating solution R are subjected to the resistance resulting from the pressure of an atmosphere upon rotation of the glass plate 60. As a consequence, the coating solution R is forced to flow in the directions of the arrows d, thereby forming localized masses R' (FIG. 5) on the respective corners of the plate glass 60. If such masses R' are formed, the coating on the entire surface of the glass plate 60 is irregular in thickness, and the commercial value of the coated product is lowered. The yield in the production process is greatly reduced.

The present invention has been made in efforts to solve the above problem in the conventional thin-film coating apparatus.

SUMMARY OF THE INVENTION

It is an object of the present invention to provide a thin-film coating apparatus which is capable of uniformly spreading a coating solution dropped on a member to form a uniformly thick coating on the member without forming localized masses thereon.

According to the present invention, there is provided an apparatus for coating a member with a thin film, comprising: a rotatable spinner for securely supporting a plate-like member onto which a coating solution is to be dropped; a casing surrounding the spinner to surround the member, the casing being firmly attached to the spinner and having an opening for allowing the member to be taken into and out of the casing; and a lid for closing the opening of the casing to define a closed processing chamber in the casing when the member and the casing rotate in unison with each other for spreading the coating solution which has been dropped on the member over the member.

The above and further objects, details and advantages of the present invention will become apparent from the following detailed description of a preferred embodiment thereof, when read in conjunction with the accompanying drawings.

BRIEF DESCRIPTION OF THE DRAWINGS

FIG. 1 is a vertical, cross-sectional view of a thin-film coating apparatus according to a preferred embodiment of the present invention;

FIG. 2 is a cross-sectional view taken along line II—II of FIG. 1;

FIG. 3 is a vertical, cross-sectional view of the thin-film coating apparatus with a lid removed and shown separately therefore;

DESCRIPTION OF THE PREFERRED EMBODIMENT

Figure 5:
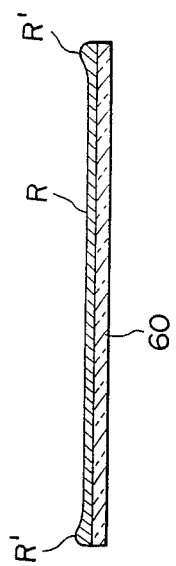
FIG. 5 is a cross-sectional view taken along line V—V of FIG. 4.
Figure 4:
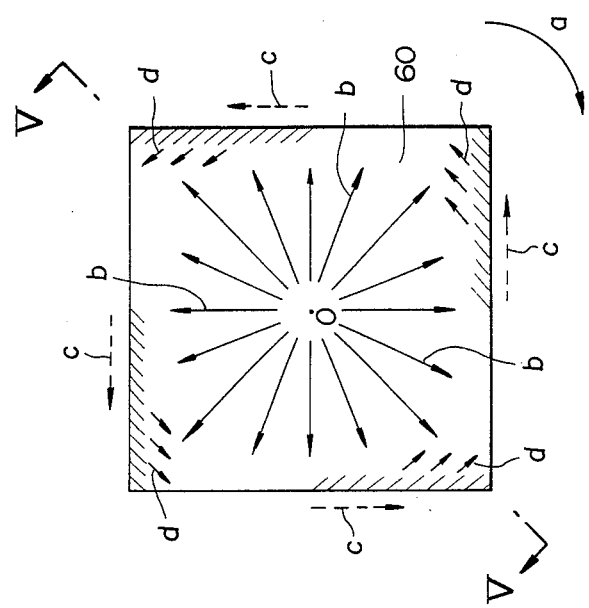
FIG. 4 is a plan view of a square plate-like member to be coated, showing flow patterns of a coating solution in a conventional thin-film coating apparatus.

FIG. 1 shows a thin-film coating apparatus, generally designated by the reference numeral 50, according to a preferred embodiment of the present invention. The thin-film coating apparatus 50 is suitable for coating the surface of a plate-like member such as a semiconductor wafer, a print circuit board, a glass plate, a printing plate, or the like with a photoresist, a diffusing agent, a coating solution for forming a silicon oxide coating, or the like. The coating apparatus 50 has a spinner 10 and a casing 1 fixedly coupled to the spinner 10.

The casing 1 comprises a circular bottom member 2 with a central hole 5 defined therein through which the spinner 10 extends, a cylindrical side wall 3 integrally formed with the outer periphery of the bottom member 2, and a circular upper wall 4 fitted in the upper portion of the side wall 3 and coupled to the upper peripheral edge of the side wall 3. The bottom member 2 has a radially inner higher stepped portion 2a and a radially outer lower stepped portion 2b, which are concentric with the central hole 5. The inner stepped portion 2a lies flush with the upper surface of the spinner 10 and serves as a processing table. Between the outer stepped portion 2b and the side wall 3, there is defined an annular channel 2c with a drain port 6 defined in the bottom of the annular channel 2c. A shutter 6a is attached to the lower opening of the drain port 6, the shutter 6a being automatically openable or detachable by the weight of an excess coating solution which is stored in the annular channel 2c. The upper wall 4 has a central circular opening 7 defined therein for permitting a plate-like member, such as a square glass plate 60, to be placed taken into and out of the casing 1. The opening 7 can be opened and closed by a lid 20 which is rotatably mounted on an arm 20a coupled to an actuator mechanism (not shown). A seal 20b is attached to the entire lower surface of the outer peripheral edge of the lid 20 for hermetically and slidably contacting the entire upper surface of the inner peripheral edge of the upper wall 4. Thus, as shown in FIGS. 1 and 3, the arm 20a is actuated so that the lid 20 hermetically closes the opening 7 by directly fitting thereinto and opens the opening by moving away therefrom. A guide plate 8 is joined to the lower surface of the inner peripheral edge of the upper wall 4 and extends entirely therealong, the guide plate 8 projecting downwardly and radially outwardly. The guide plate 8 is of a frustoconical shape and positioned laterally of the glass plate 60 placed on the spinner 10. The lower edge of the guide plate 8 is vertically aligned with the radially central portion of the annular channel 2c.

The spinner 10 has a circular suction recess 12 defined in the upper surface thereof and connected to a vacuum source (not shown) through a suction passage 11 defined in the spinner 10. When the vacuum source is operated, the glass plate 60 placed on the spinner 10 is attracted and securely fixed to the spinner 10 under vacuum suction. The spinner 10 has a lower portion coupled to a rotational driver mechanism such as a motor (not shown).

A process of coating the glass plate 60 in the thin-film coating apparatus 50 will be described below.

First, as shown in FIG. 3, the lid 20 is moved upwardly to open the opening 7. Then, the glass plate 60 is brought into the casing 1 through the opening 7 and set on the spinner 10, after which the vacuum source is operated to hold the glass plate 60 on the spinner 10 under a vacuum applied through the suction recess 12 and the suction passage 11. A prescribed amount of a coating solution such as a photoresist, for example, is applied as droplets from a nozzle (not shown) to the center of the glass plate 60. Thereafter, the opening 7 is closed by the lid 20 to define a processing chamber S shown in FIG. 1, and the spinner 10 and the casing 1 are rotated at a high speed. The glass plate 60 is rotated with the spinner 10 to force the dropped coating solution to be spread radially outwardly and uniformly over the glass plate 60 to the outer peripheral edge thereof under centrifugal forces. Any excess coating solution is scattered off the outer peripheral edge of the glass plate 60, and applied to the guide plate 8. The coating solution applied to the guide plate 8 is then moved downwardly along the surface of the guide plate 8 until finally it falls off the lower edge of the guide plate 8 into the annular channel 2c. The guide plate 8 is effective in preventing the coating solution droplets scattered off the edge of the glass plate 60 from being reapplied to (or scattered back onto) the glass plate 60.

While the spinner 10 and the casing 1 are rotating together at a high speed, the inner processing chamber S in the casing 1 remains a closed space. Therefore, an atmosphere such as air in the casing 1 rotates or flows in the same direction as that in which the spinner 10 and the casing 1 rotate. Therefore, substantially no air stream is developed in the processing chamber S against the spinner 10, the casing 1, and the glass plate 60. As a result, the coating solution on the glass plate 60 is not subjected to any resistance which would otherwise result from the pressure of the atmosphere in the processing chamber S, and is thus allowed to spread uniformly over the glass plate 60 without forming unwanted localized masses. As the coating solution undergoes no resistance from the pressure of the atmosphere, any excess coating solution on the glass plate 60 can easily be scattered off the edge of the glass plate 60 toward the guide plate 8.

At the time the casing 1 rotates in unison with the spinner 10, the lid 20 rotatably installed on the arm 20a also rotates in unison with the casing 1. At this time, the junction between the upper wall 4 and the lid 20 is hermetically sealed by the seal 20b.

In the thin-film coating apparatus 50, as described above, the casing 1 is firmly joined to the spinner 10, and the processing chamber S is closed by the lid 20 when the spinner 10, the casing 1, and the member 60 to be coated are rotated in unison at a high speed. Therefore, regardless of the configuration of the member 60 to be coated, the coating solution dropped on the member 60 is uniformly spread thereover to form a uniformly thin coating without producing unwanted localized masses thereon. As a consequence, a coated product of good quality is produced, and the yield of acceptably coated products is improved in the production process.

Although there has been described what is at present considered to be the preferred embodiment of the present invention, it will be understood that the invention may be embodied in other specific forms without departing from the essential characteristics thereof. The present embodiment is therefore to be considered in all aspects as illustrative, and not restrictive. The scope of the invention is indicated by the appended claims rather than by the foregoing description.

We claim:

1. An apparatus for coating a member with a thin film, comprising:
    a rotatable spinner for securely supporting a plate-like member onto which a coating solution is to be dropped;
    a casing surrounding said spinner to surround the member, said casing being firmly attached to said spinner and having an opening for allowing the member to be taken into and out of said casing;
    a lid for closing said opening of said casing to define a closed processing chamber in said casing when the member and said casing rotate in unison with each other for spreading the coating solution which has been dropped on the member over the member;
    said casing comprising a bottom member firmly attached to said spinner, a sidewall joined to an outer periphery of said bottom member, and an upper wall coupled to an upper peripheral edge of said sidewall, said opening being defined in said upper wall, said bottom member and said sidewall jointly defining an annular channel in said processing chamber and said annular channel having a drain port;
    a guide plate attached to and extending fully along a lower edge of said upper wall defining said opening, said guide plate projecting downwardly and radially outwardly, and said guide plate being positioned so as to be located laterally of the plate-like member and having a lower edge vertically aligned with said annular channel;

said lid having a seal attached to a lower surface thereof and extending fully along a peripheral edge of said lid for hermetically contacting the entire periphery of said opening; and an arm, said lid being rotatably supported on said arm for rotation in unison with said casing.

2. An apparatus according to claim 1, wherein said spinner has a mechanism for attracting and fixing said plate-like member to said spinner.

3. Apparatus according to claim 1, wherein said seal attached to said lid hermetically contacts the entire periphery of the upper edge of said upper wall defining said opening.

4. An apparatus according to claim 1, further including means for actuating said arm so that said lid hermetically closes said opening by directly fitting thereinto and opens said opening by moving away therefrom.

* * * * *

UNITED STATES PATENT AND TRADEMARK OFFICE
CERTIFICATE OF CORRECTION

PATENT NO. : 4,941,426

DATED : July 17, 1990

INVENTOR(S) : Hiroyoshi SAGO et al.

It is certified that error appears in the above-identified patent and that said Letters Patent is hereby corrected as shown below:

Column 2, line 35, change "therefore" to --therefrom--.

Column 3, line 7, delete "taken"; after "and" insert --taken--.

Signed and Sealed this

Eighteenth Day of February, 1992

Attest:

HARRY F. MANBECK, JR.

*Attesting Officer*   *Commissioner of Patents and Trademarks*